United States Patent [19]

Neff et al.

[11] Patent Number: 5,023,897
[45] Date of Patent: Jun. 11, 1991

[54] DEVICE FOR GENERATING X-RADIATION WITH A PLASMA SOURCE

[75] Inventors: Willi Neff, Kelmis, Belgium; Raymond Holz, Herzogenrath, Fed. Rep. of Germany; Rainer Lebert, Aachen, Fed. Rep. of Germany; Franz Richter, Olching, Fed. Rep. of Germany

[73] Assignee: Carl-Zeiss-Stiftung, Heidenheim/Brenz, Fed. Rep. of Germany

[21] Appl. No.: 568,193

[22] Filed: Aug. 16, 1990

[30] Foreign Application Priority Data

Aug. 17, 1989 [DE] Fed. Rep. of Germany ....... 3927089

[51] Int. Cl.$^5$ .............................................. H01J 35/00
[52] U.S. Cl. .................................... 378/122; 378/123; 378/119; 378/136; 315/111.71; 315/111.21; 315/111.61
[58] Field of Search ............... 378/122, 123, 119, 136; 315/111.21, 111.41, 111.71, 111.61

[56] References Cited

U.S. PATENT DOCUMENTS 4,596,030 6/1986 Herziger et al. .................... 378/119
4,792,725 12/1988 Levy et al. ...................... 315/111.21

Primary Examiner—Edward P. Westin
Assistant Examiner—Don Wong
Attorney, Agent, or Firm—Eugene Stephens & Associates

[57] ABSTRACT

The invention is an improvement in a device for generating X-radiation with a plasma source. In the device, two concentric cylindrical electrodes (11, 12) are separated by an evacuated discharge space (13) filled with low-pressure gas. When the inner electrode is momentarily raised to an extremely high voltage, the gas is ionized and a plasma shock wave (17, 17') is created and compressed into a plasma focus (21) emitting X-radiation (20). The improvement introduces a first ("discharge") gas into the discharge space for initiation of the plasma, while introducing a second ("emitting") gas into the inner electrode for generating the X-radiation in the plasma focus. Special features of the improved device include a plurality of gas extraction ports, which can be used independently or together, and which can be combined with variations in the introduction and flow of the two gases to control the movement and intermixture of the gases and, thereby, the operation of the device. Also, the device introduces a third gas for improving the transmission of the X-radiation from the generating plasma focus to a work station for X-ray microscopy or for X-ray lithography.

12 Claims, 1 Drawing Sheet

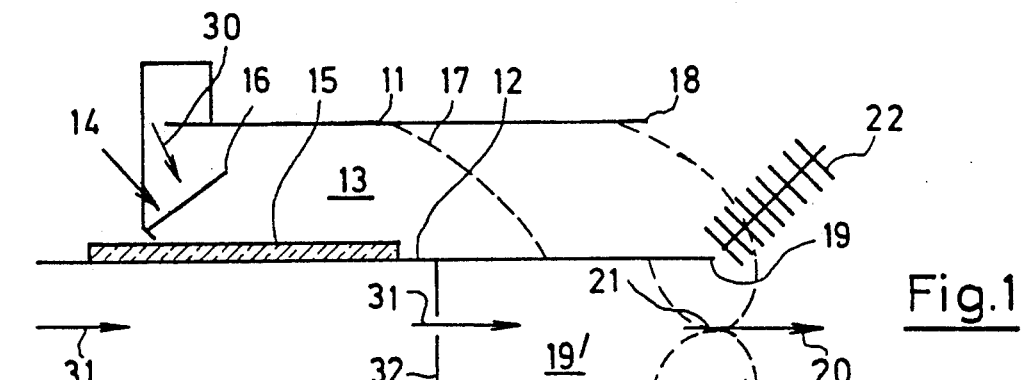
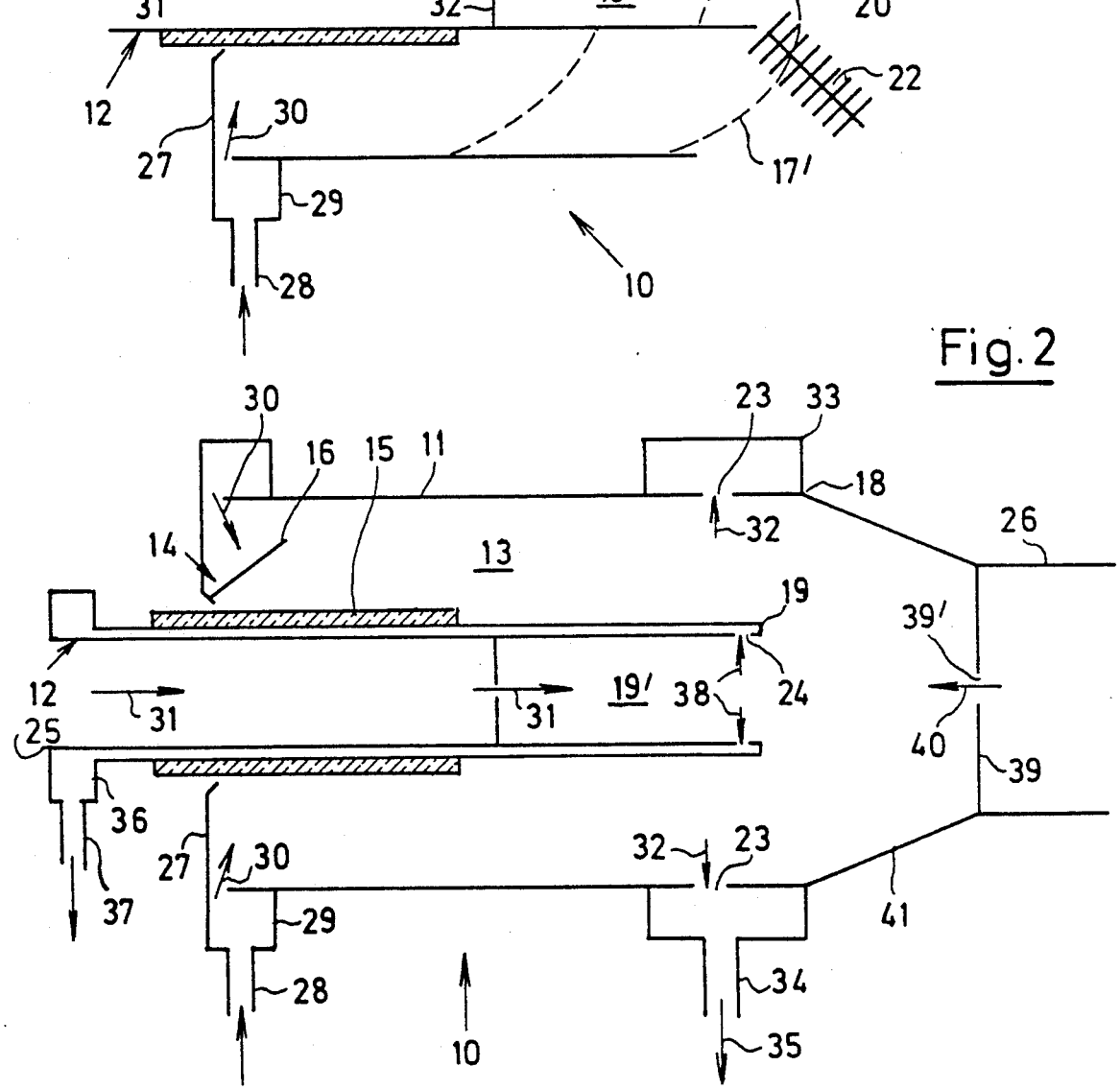

DEVICE FOR GENERATING X-RADIATION WITH A PLASMA SOURCE

TECHNICAL FIELD

This invention relates to apparatus for generating X-radiation and, more particularly, to a device for generating X-radiation with a plasma source.

BACKGROUND

U.S. Pat. No. 4,596,030 (assigned to Carl Zeiss Stiftung) discloses a device for generating X-radiation with a plasma. This prior art device comprises two concentric cylindrical electrodes connected to a high-voltage electrical energy source with a controlled high-power switch. Formed between the electrodes is a discharge space which is closed at one end, evacuated, and filled with low-pressure gas. An insulator is arranged between the electrodes along with means for initiating a plasma discharge. This plasma shock wave is accelerated toward the open end of the discharge space and, in the region of the open end of the cylindrical inner electrode, is magnetically compressed into a plasma focus emitting X-radiation. This prior art device is operated with a gas charge or with a steady through-flow of gas. Only a single gas is used, so that both the plasma discharge and the generation of the desired X-radiation takes place in one and the same gas.

It has been found that this known device exhibits a number of disadvantages. For example, the gas used in the device must be selected so that it will create the desired plasma discharge. However, since the spectral properties of the generated X-radiation varies in accordance with the type of gas employed, the gas selected (for its plasma discharge characteristics) may produce a very low yield of X-radiation of a desired wavelength. Or, when a gas is selected to obtain a needed wavelength of X-radiation, the generation of the plasma may be less than desired.

The invention herein provides means for improving the prior art device just described above so that it can achieve optimal conditions for the creation of the plasma and for acceleration of the plasma toward the open end of the cylindrical inner electrode while, simultaneously, achieving optical conditions for generating X-radiation of the desired wavelength.

SUMMARY OF THE INVENTION

In accordance with the invention, structure is provided for delivering separate and distinct gases to different regions of the device. A "discharge" gas, which is optimal for initiation of the plasma discharge and/or for plasma acceleration, is delivered to the discharge space between the electrodes, while an "emitting" gas, which is optimal for generating X-radiation of the desired wavelength, is introduced at least in the region of the plasma focus in the open end of the inner electrode. Further, means are provided for evacuating both the emitting gas and the discharge gas in a controlled manner so as to assure minimal intermixing of the gases in the discharge space.

The discharge gas is optimized with regard to specific parameters (e.g., gas pressure, voltage, and electric field strength) important for initiation of the plasma discharge and/or for plasma acceleration. Helium or another noble gas may be appropriately selected as a discharge gas. In this regard, in optimizing the acceleration of the plasma shock wave toward the open end of the discharge space, specific adjustments can be made to the length and the diameter of the inner electrode.

The emitting gas is selected to produce X-radiation with an optimal radiation yield in the desired wavelength range. For example, for radiation used in X-ray microscopy or in X-ray lithography, the desired wavelength range is approximately 0.5 to 5 nm; and so nitrogen, which produces good yields in the 2.5 nm range, might be selected for such uses.

However, the emitting gas may have a detrimental effect on the initiation of the plasma discharge and/or its acceleration, while the discharge gas may adversely affect the generation of the desired X-radiation. Therefore, a further important feature of the invention relates to the control of the two gases to minimize inappropriate intermixing of the gases. Such control is achieved by the manner in which the gases are injected into their respective chambers and, thereafter, evacuated from the device.

The discharge gas is injected into the closed end of the discharge space between the electrodes, while the emitting gas is injected into the interior of the inner electrode. Both gases are injected toward the open end of the inner electrode.

In one embodiment, the two gases are injected with steady flows, which results in an intermixing zone located substantially in front of and outside the diameter of the inner tube. This intermixing zone does not impair the creation of the plasma shock wave in the discharge space nor does it interfere with the generation of the X-radiation in the region in front of the open end of the inner tube; instead, both of these principle functions can take place without interference from the other gas in each case.

In a second embodiment, the gas volumes are injected pulsewise so that discharge gas fills the discharge space at the time of the plasma discharge, while the emitting gas moves into the region of the open end of the inner tube during the phase of X-radiation generation. Thus, in this second embodiment, there is a kind of pulse filling, which is timed so that intermixing does not occur until after the desired X-radiation has first been generated.

To further facilitate control of the gases, gas extraction ports are positioned around the circumference of the outer electrode in the vicinity of the open end of the inner electrode. Thus, any emitting gas emanating from the open end of the inner electrode is immediately drawn toward these nearby extraction ports. As a consequence, the concentration of the emitting gas in the discharge space between the inner and outer electrodes is low; and any intermixing of the gases in the discharge space takes place, if at all, near the extraction ports and well away from the region in which the plasma discharge shock wave is initiated.

For additional control of the gas flow, the inner electrode tube of the inventive device is designed with a double wall, and further extraction ports are positioned around the circumference on the inner side of the tube in the region of its open end. By using these ports, the amount of emitting gas present in the region in front of the open end of the inner electrode can be kept as small as possible.

The two sets of extraction ports described above serve to establish the maximal and the minimal boundaries of the region containing the emitting gas. By using one or both of these sets and/or adjusting their respective levels of extraction, the amount of gas intermixing and the relative positions of the zones of such intermixing can be regulated.

However, it has also been found that the neutral (i.e., non-ionized) emitting gas is itself excitable by, and readily absorbs, X-radiation. Therefore, any emitting gas present in front of the plasma focus (i.e., the pinch point of the plasma shock wave which generates the X-radiation) tends to absorb the radiation, reducing the intensity of the beam being conveyed to a work station for X-ray microscopy or X-ray lithography. Therefore, evacuation or extraction of the emitting gas is not only important in regard to minimizing its effect on the initiation of the plasma discharge, but it is equally important to assure the maximum transmission of the X-radiations to the processing station.

As a further means for controlling the undesired movement of the emitting gas, the invention provides a beam tube which is arranged in front of the region of the open end of the inner electrode and coaxial therewith. This beam tube is filled with a beam-tube gas which is optimal for the transmission of the X-radiation, and the gas is under sufficient pressure to assure that no emitting gas can advance into the beam tube so that, at least in the region defined by the beam tube, the transmission of the desired X-radiation can be optimized by the selection of an appropriate beam-tube gas.

Also, the beam-tube gas is allowed to flow into the region of the open end of the inner electrode and is extracted via its extraction ports. In this manner, the inflow of the beam-tube gas can be controlled to limit the axial flow of emitting gas into the region of the open end of the inner electrode, thereby further reducing the losses of X-radiation due to its absorption by non-ionized emitting gas.

DRAWINGS

FIG. 1 is a schematic cross section of a device for generating X-radiation in accordance with the invention.

FIG. 2 shows a device similar to FIG. 1 modified by the addition of gas extraction means and a beam tube for transmitting the X-radiation.

DETAILED DESCRIPTION

The device 10, illustrated schematically in the accompanying drawings, is a modification of the prior art X-radiation generator which is shown in detail in FIG. 1 of U.S. Pat. No. 4,596,030.

As shown in accompanying FIG. 1, device 10 has two concentric cylindrical electrodes 11, 12, which are connected to a high-voltage electrical energy source by a controllable high-power switch (not shown). In operation, which will be described in greater detail below, inner electrode 12 is momentarily raised to a voltage potential of several tens of kilovolts relative to the outer electrode 11, which may, for example, be at ground potential; and this initiates an ionization processes in the discharge space 13 between the electrodes 11, 12.

The left end 14 of discharge space 13 is closed with an annular wall 27, and between wall 27 and inner electrode 12 is an insulator 15 in the form of a cylinder tightly enclosing inner electrode 12. Insulator 15 shields wall 27 of discharge space 13 from the voltage present on inner electrode 12. However, wall 27 is electrically connected to outer electrode 11 and thus has its potential.

The inner circumference of wall 27 forms, by means of a turned-over edge, an initiating means 16 for a plasma discharge. When inner electrode 12 is momentarily raised to the extremely high potential just referred to above, initiating means 16 ionizes the gas in discharge space 13 and creates a plasma shock wave (illustrated schematically as wave front 17) which, because confined by wall 27, moves to the right and is thus strongly accelerated toward the open end of discharge space 13. When plasma wave front 17 reaches the open end of discharge space 13 and thus moves into the region of the open end 19 of inner tube 12, it is constricted by strong magnetic forces, as shown at 17'. This creates a plasma pinch or focus 21 in which ionized gas is compressed to generate radiation consisting primarily of X-radiation 20. This X-radiation is then transmitted to a processing station.

Discharge space 13 is filled with a gas which flows, by means of a gas supply line 28 and an annular duct 29, into closed end 14 of discharge space 13 as indicated by arrows 30. From this injection point, the gas flows toward open end 18 of outer electrode 11. The composition of the discharge gas and its input pressure is selected to optimize the initiation and acceleration of the plasma shock wave. The discharge gas is evacuated from the open end of the discharge space 13 (by means not shown in FIG. 1) so that an underpressure prevails in discharge space 13.

In the interior 19' of inner electrode 12, an emitting gas is injected as indicated by arrows 31. When the gases are injected in a pulsed manner, as referred to above, a diaphragm 32 serves to limit the quantity or restrict the entry of discharge gas in the interior 19' of inner electrode 12.

In the embodiment illustrated in FIG. 1, a portion of the emitting gas advances into a region located substantially to the right of the open end 19 of inner electrode 12 and forms intermixing zones 22 with the discharge gas emanating from discharge space 13, the position of these intermixing zones 22 varying in accordance with the pressure and the flow conditions of the two gases. Ideally, intermixing zones 22 are appropriately controlled by pressure and flow rates to form in the regions illustrated in FIG. 1, namely, so that they lie substantially in front of and outside the diameter of inner electrode 12. When intermixing zones 22 are limited to these regions, discharge space 13 remains generally free of emitting gas, and the region in front of open end 19 of inner electrode 12 remains generally free of discharge gas. Plasma wave front 17 can thus be initiated and accelerated in discharge space 13 with relatively little hindrance from the emitting gas, while the plasma compressed in focus 21 is formed almost exclusively from emitting gas, so that optimal conditions prevail for the initiation of the plasma shock wave, and for the generation of the desired X-radiation, respectively. As indicated above, this separation of the two gases can be further enhanced in the embodiment of FIG. 1 if the gases are introduced by pulsing injection, in contrast to injection by steady flow.

Control of the discharge and emitting gases is greatly facilitated in the embodiment illustrated schematically in FIG. 2 in which means are provided for the extraction of the gases.

Extraction from discharge space 13 is accomplished by means of extraction ports 23 which are located in proximity to its open end 18, being distributed around the circumference of outer electrode 11. Thus gas flows, as indicated by arrows 32, through extraction ports 23 into an annular duct 33, and from there through an extraction port 34, as indicated by arrow 35, to an extraction means.

In this embodiment, inner electrode 12 is double-walled and has extraction ports 24 at its open end 19, which extraction ports are similarly distributed around the inner circumference of inner electrode 12. At the other end of inner electrode 12, there is an annular duct 36 with an extraction port 37, which is also connected to an extraction means. When ports 24 are used, gas is extracted from the region of the open end 19 of inner electrode tube 12 as indicated by arrows 38.

As discussed above, extraction can take place either through extraction ports 23 alone, or through extraction ports 24 alone, or through both and in varying degrees. Also, as previously indicated, the inflowing quantities or pressures of the discharge gas or of the emitting gas can be regulated. Accordingly, by varying these parameters, it is possible to control the movement of the gases, of primary interest being the disposition of the emitting gas and limiting its intermixture with the discharge gas.

Another feature of the embodiment in FIG. 2 is the beam tube 26 which is arranged coaxially to the right of electrodes 11, 12 and which is filled with a beam-tube gas. This serves for the transmission of the generated X-radiation to a work station. A diaphragm 39, which closes the end of beam tube 26, has an aperture 39' for receiving and passing the X-rays. The beam-tube gas is optimal for the transmission of X-radiation; that is, it has a particularly low absorption coefficient, so that transmission takes place with relatively little loss of energy. An appropriate beam-tube gas is, for example, oxygen.

As noted earlier, it has been found that the emitting gas readily absorbs X-radiation; and, for that reason, its presence in front of plasma focus 21 is undesirable. Therefore, in this embodiment of the invention, the transmission gas which is already present in beam tube 26 is moved as near as possible to plasma focus 21. Since it is not possible to attach beam tube 26 to open end 19 of inner electrode 12 (because space is required for plasma shock wave 17 to be constricted into focus 21), the beam-tube gas is allowed to flow through diaphragm aperture 39' into the region of the open end 19 of the inner tube 12 as indicated by arrow 40. This beam-tube gas is drawn, along with the other two gases, toward extraction ports 32 and/or 24; and this movement of the beam-tube gas is facilitated by conical sealing insulation 41 which is positioned circumferentially between open end 18 of outer electrode 11 and beam tube 26.

We claim:

1. In a device for generating, X-radiation with a plasma source, said device having concentric inner and outer cylindrical electrodes (11, 12) separated by an insulator (15) and connected to a high-voltage electrical energy source with a controlled high-power switch, said electrodes forming between them an evacuated discharge space (13) closed at one end (14) and filled with low-pressure gas, and having means (16) for initiating a plasma discharge so that the plasma is accelerated to the other end (18) of the discharge space and, in the region of an open end (19) of the cylindrical inner electrode (12), is compressed into a plasma focus (21) emitting X-radiation, the improvement comprising:

a first duct for injecting a discharge gas, which is optimal for initiating and accelerating the plasma, into said discharge space;

a second duct for injecting an emitting gas, which is different from said discharge gas and which provides an optimal yield of X-radiation in a selected wavelength range, into said inner cylindrical electrode; and an extraction duct, spaced from said first and second ducts, for evacuating said emitting and discharge gases for minimizing the intermixing of said gases in said discharge space.

2. A device in accordance with claim 1 wherein said first duct for injecting the discharge gas is positioned at the closed end of said discharge space, and wherein said second duct injects the emitting gas into the interior of the inner electrode.

3. A device in accordance with claim 2 wherein said first and second ducts inject the gases toward the open end of the inner cylindrical electrode.

4. A device in accordance with claim 2 wherein said first and second ducts inject the two gases with steady flows, so that said gases are intermixed in a zone located substantially in front of and outside the diameter of the inner electrode.

5. A device in accordance with claim 2 wherein at least one of said first and second ducts injects its respective gas pulsewise.

6. A device in accordance with claim 1 wherein said extraction duct is positioned on the circumference of the outer electrode in the vicinity of the open end of the inner electrode.

7. A device in accordance with claim 6 wherein said extraction duct comprises a plurality of extraction ports arranged around the circumference of said outer electrode.

8. A device in accordance with claim 1 wherein said inner electrode is a double-walled tube and said extraction duct is positioned on the inner side of the tube in the region of its open end.

9. A device in accordance with claim 8 wherein said extraction duct comprises a plurality of extraction ports arranged around the circumference of the inner side of said tube.

10. A device in accordance with claim 1 further comprising a beam tube arranged in front of the open end of the inner electrode and coaxial therewith, said beam tube being filled with a beam-tube gas optimal for the transmission of X-radiation.

11. A device in accordance with claim 10 wherein said beam-tube gas in the region of the open end of the inner electrode is extracted by said extraction duct.

12. A device for generating x-radiation from a plasma, said device comprising:

a discharge space filled with a discharge gas and having an open end;

a radiation-emitting space adjacent the open end of the discharge space and filled with an emitting gas, the discharge gas and the emitting gas being different gases;

means for initiating a plasma discharge within said discharge space; and means for preventing intermixture of said gases within said discharge space and within said radiation-emitting space.

* * * * *